(12) United States Patent
Abou-Khalil et al.

(10) Patent No.: US 9,716,136 B1
(45) Date of Patent: Jul. 25, 2017

(54) EMBEDDED POLYSILICON RESISTORS WITH CRYSTALLIZATION BARRIERS

(71) Applicant: GLOBALFOUNDRIES INC., Grand Cayman (KY)

(72) Inventors: Michel J. Abou-Khalil, Essex Junction, VT (US); Steven M. Shank, Jericho, VT (US); Anthony K. Stamper, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/071,641

(22) Filed: Mar. 16, 2016

(51) Int. Cl.
| | |
|---|---|
| *H01L 21/033* | (2006.01) |
| *H01L 21/768* | (2006.01) |
| *H01L 23/525* | (2006.01) |
| *H01L 27/12* | (2006.01) |
| *H01L 49/02* | (2006.01) |

(52) U.S. Cl.
CPC .................. *H01L 28/20* (2013.01)

(58) Field of Classification Search
CPC .......................... H01L 21/76838; H01L 28/20
USPC .......................................................... 438/385
See application file for complete search history.

(56) References Cited

U.S. PATENT DOCUMENTS

| | | | |
|---|---|---|---|
| 5,140,299 A | 8/1992 | Andrews, Jr. et al. | |
| 6,703,283 B1 | 3/2004 | Ballantine et al. | |
| 7,939,911 B2 | 5/2011 | Abadeer et al. | |
| 8,669,146 B2 | 3/2014 | Abou-Khalil et al. | |
| 8,748,985 B2 | 6/2014 | Abou-Khalil et al. | |
| 8,765,536 B2 | 7/2014 | Assefa et al. | |
| 8,796,747 B2 | 8/2014 | Assefa et al. | |
| 8,962,420 B2 | 2/2015 | Kurz et al. | |
| 2008/0102569 A1* | 5/2008 | Cheng | H01L 21/84 438/156 |
| 2010/0078727 A1* | 4/2010 | Min | H01L 21/84 257/369 |
| 2011/0241124 A1* | 10/2011 | Kurz | H01L 21/28518 257/379 |
| 2016/0099169 A1* | 4/2016 | Cheng | H01L 27/1203 438/57 |

* cited by examiner

*Primary Examiner* — Moazzam Hossain
*Assistant Examiner* — Omar Mojaddedi
(74) *Attorney, Agent, or Firm* — Gibb & Riley, LLC; Michael J. LeStrange, Esq.

(57) ABSTRACT

A method of forming an embedded polysilicon resistor body contact. According to the method, a transistor is formed in and above a crystalline active region that is positioned in a semiconductor layer of a multilayer semiconductor device. A resistor region is defined in single crystal semiconductor material of the semiconductor layer formed on a buried insulating layer. The resistor region is adjacent the transistor. An amorphized semiconductor material is formed in the resistor region. A barrier is formed in the amorphized semiconductor material. The barrier is between the transistor and an electrical body contact for the transistor. The amorphized semiconductor material is annealed, forming a polysilicon semiconductor. The barrier prevents the amorphized region from recrystallizing back to single crystal silicon.

12 Claims, 10 Drawing Sheets

EMBEDDED POLYSILICON RESISTORS WITH CRYSTALLIZATION BARRIERS

BACKGROUND

The present disclosure relates to integrated circuit design and more particularly to fabricating resistors in semiconductor layers of field effect transistors.

Electronic devices, particularly integrated circuits, comprise a large number of components fabricated by layering several different materials onto a silicon wafer. In order for the components to function as an electronic device, they are selectively, electrically connected to one another. Metal lines are utilized to electrically connect components. The metal lines provide electrical connection within a layer, while vias connect different metallization and via layers.

In modern integrated circuits, a high number of individual circuit elements, such as field effect transistors in the form of CMOS, NMOS, PMOS elements, resistors, capacitors and the like may be formed on a single chip area. Typically, feature sizes of such circuit elements are steadily decreasing with the introduction of every new circuit generation, to provide currently available integrated circuits with an improved degree of performance in terms of speed and/or power consumption. A reduction in size of transistors is an important aspect in steadily improving device performance of complex integrated circuits, such as CPUs. The reduction in size commonly brings about an increased switching speed, thereby enhancing signal processing performance.

Although transistor elements are the dominant circuit element in highly complex integrated circuits, which substantially determine the overall performance of these devices, other components, such as capacitors and resistors, may be required. The size of these passive circuit elements may also have to be adjusted with respect to the scaling of the transistor elements in order to not unduly consume valuable chip area.

SUMMARY

Multi-finger, multi-stack switch FET geometries require high resistance bias resistors to bias the gate, source, drain, and body. As the switch FET geometries are aggressively scaled, reduction in parasitics is required to reduce Ron-Coff. There is also a desire to add functionality by offering resistors with multiple resistance values with no additional masks. The present disclosure describes methods and structures to form embedded poly and single-xtal silicon resistors with multiple resistances and reduced wiring capacitance.

In particular, the present disclosure provides a method to form and separate buried resistive structures using a recrystallization barrier. A buried resistive structure may be formed by amorphizing a semiconductor material and subsequently re-crystallizing the semiconductor material in a single crystalline state. According to devices and methods herein, the re-crystalized semiconductor material is isolated from the transistor components, not the electrical connections. This allows integration within the body contact region of the FET structure.

According to a method, a transistor is formed in and above a crystalline active region that is positioned in a semiconductor layer of a multilayer semiconductor device. A resistor region is defined in single crystal semiconductor material of the semiconductor layer formed on a buried insulating layer. The resistor region is adjacent the transistor. An amorphized semiconductor material is formed in the resistor region. A barrier is formed in the amorphized semiconductor material. The barrier is between the transistor and an electrical body contact for the transistor. The amorphized semiconductor material is annealed, forming a polysilicon semiconductor. The barrier prevents the amorphized semiconductor material in the resistor region from recrystallizing back to single crystal silicon.

According to a method, an isolation structure is formed in layers of a multilayer semiconductor device. The isolation structure laterally defines an isolated semiconductor region in the semiconductor layers. A transistor is formed in and above a crystalline active region that is positioned in a semiconductor layer of the multilayer semiconductor device. A resistor region is defined in the semiconductor layer. The isolation structure is between the resistor region and the transistor. A barrier is formed in the isolation structure. An amorphized semiconductor material is formed in the resistor region. The amorphized semiconductor material is annealed. The barrier prevents the amorphized semiconductor material in the resistor region from recrystallizing back to single crystal silicon.

According to another method, a resistor region and a crystalline active region are formed in a semiconductor layer that is formed on a buried insulating layer. A transistor element is formed in and above the crystalline active region. An amorphized semiconductor material is formed in the resistor region. A barrier is formed in the amorphized semiconductor material. The barrier is between the transistor element and an electrical body contact for the transistor element. The amorphized semiconductor material is annealed. The anneal process recrystallizing the amorphized semiconductor material so that it becomes polycrystalline in structure.

BRIEF DESCRIPTION OF THE DRAWINGS

The devices and methods herein will be better understood from the following detailed description with reference to the drawings, which are not necessarily drawn to scale and in which.

DETAILED DESCRIPTION

For a general understanding of the features of the disclosure, reference is made to the drawings. It will be readily understood that the devices and methods of the present disclosure, as generally described and illustrated in the drawings herein, may be arranged and designed in a wide variety of configurations in addition to the devices and methods described herein. In the drawings, like reference numerals have been used to identify identical elements. While the disclosure will be described hereinafter in connection with specific devices and methods thereof, it will be understood that limiting the disclosure to such specific systems and methods is not intended. Thus, the following detailed description of the devices and methods, as represented in the drawings, is not intended to limit the scope defined by the appended claims. On the contrary, it is intended to cover all alternatives, modifications, and equivalents as may be included within the spirit and scope of the disclosure as defined by the appended claims.

Figure 1:
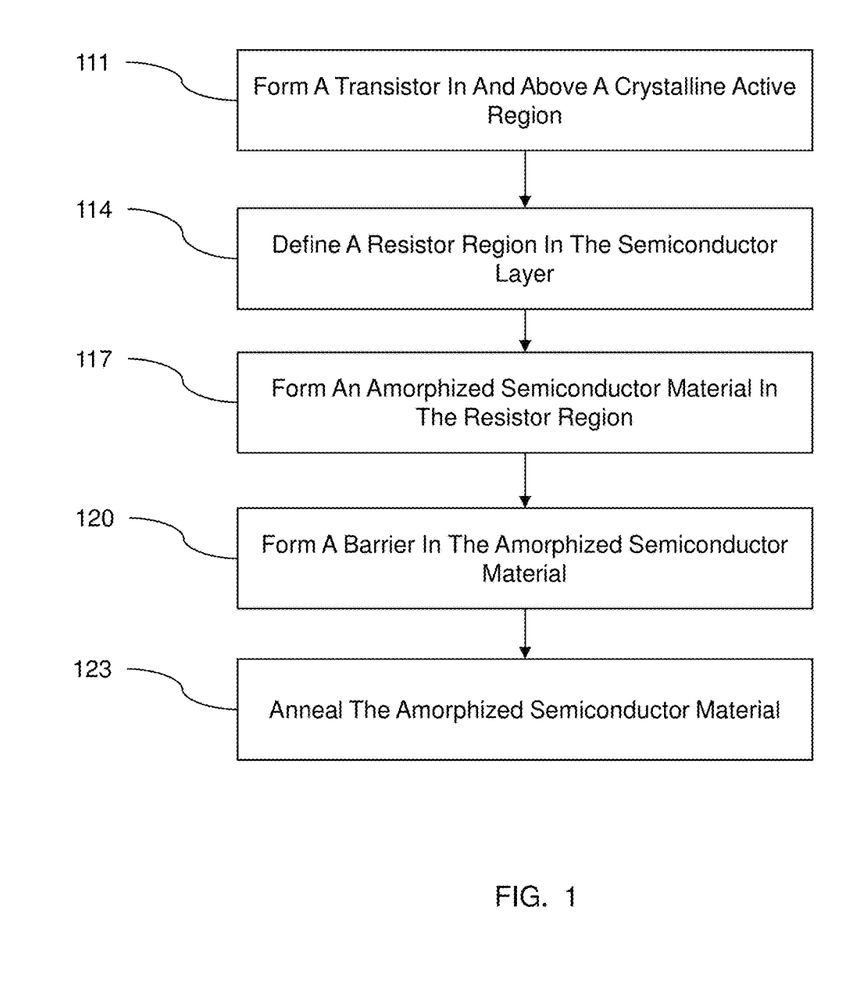
FIG. 1 is a flow diagram illustrating a high-level processing flow according to devices and methods herein.

FIG. 1 is a flow diagram illustrating the processing flow of an exemplary method to form embedded poly and single-xtal silicon resistors with multiple resistances and reduced wiring capacitance according to devices and methods herein. According to such a method, at 111 a transistor is formed in and above a crystalline active region. The crystalline active region is positioned in a semiconductor layer of a multilayer semiconductor device. At 114, a resistor region is defined in the semiconductor layer formed on a buried insulating layer. The resistor region is adjacent the transistor. At 117, an amorphized semiconductor material is formed in the resistor region. At 120, a barrier is formed in the amorphized semiconductor material. The barrier is between the transistor and an electrical body contact for the transistor. At 123, the amorphized semiconductor material is annealed. The annealing forms a polycrystalline semiconductor.

Figure 2:
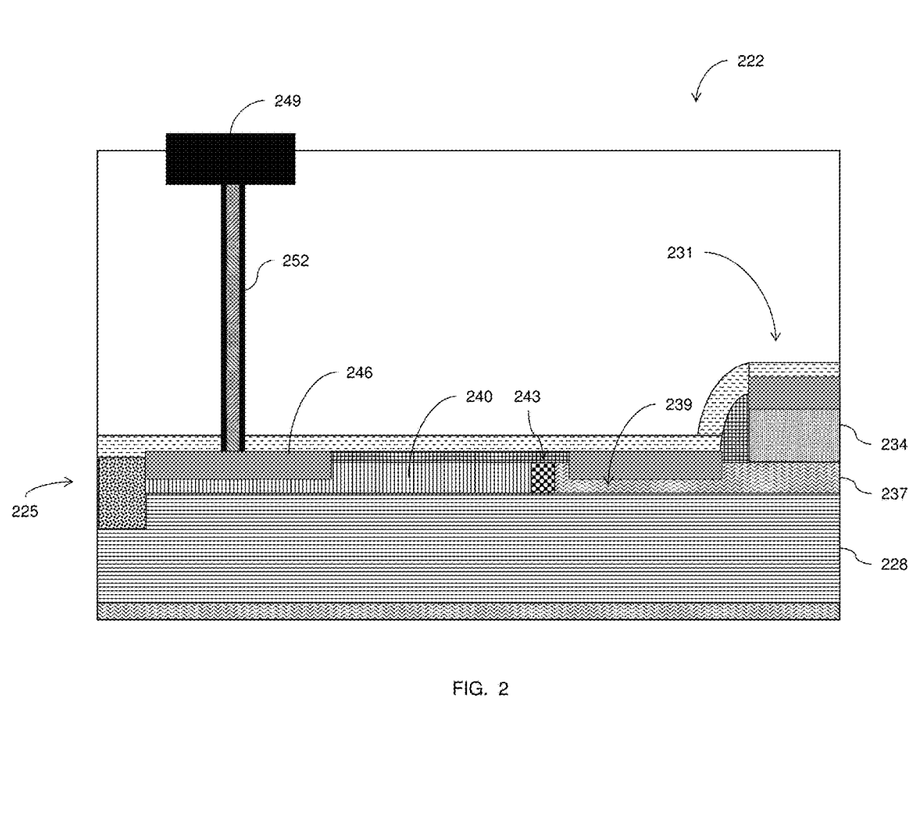
FIGS. 2-10 are elevational views of a semiconductor structure illustrating aspects of devices and methods herein.

FIG. 2 shows a portion of a semiconductor wafer, indicated generally as 222, having an embedded polysilicon resistor body contact. The wafer 222 comprises a multilayer substrate 225, which may comprise any conventional semiconductor substrate such as, for example, a bulk silicon substrate or an active layer of semiconductor material of a silicon-on-insulator (SOI) wafer. The multilayer substrate 225 may include a buried oxide (BOX) layer 228 and an active component, such as a field effect transistor (FET) 231, as would be known by one of ordinary skill in the art. As shown in FIG. 2, only a portion of the FET 231 is illustrated with a gate portion 234 and a p-well region 237 of the FET 231. The p-well region 237 extends to the left of the gate portion 234 to form the p-doped body contact region 239. The gate portion 234 is used to separate the FET 231 from the body contact region 239, and is not an active gate. On the body contact side of the gate 234 is the p-doped body contact region 239, and on the FET side of the gate 234 are alternating n-type and p-type regions. In this example, the n-type regions are the S/D regions of the active FETs 231 and the p-type regions are the wells of the active FETs 231. The multilayer substrate 225 may also include a p-type polysilicon resistor 240 formed by amorphizing a single crystal silicon, forming a recrystallization barrier 243, and recrystallizing to polysilicon using a thermal anneal. The recrystallization barrier 243 may be formed using ion implant of carbon (C), oxygen (O), fluorine (F), nitrogen (N), argon (Ar), or xenon (Xe) into the amorphized single crystal silicon. Other appropriate materials may be used. The recrystallization barrier 243 prevents the amorphized region of the polysilicon resistor 240 from recrystallizing back to single crystal silicon. The polysilicon resistor 240 may be connected to a body contact 246, which is connected to an electrical contact 249 by a via 252 or other means known by one of ordinary skill in the art.

Figure 3:
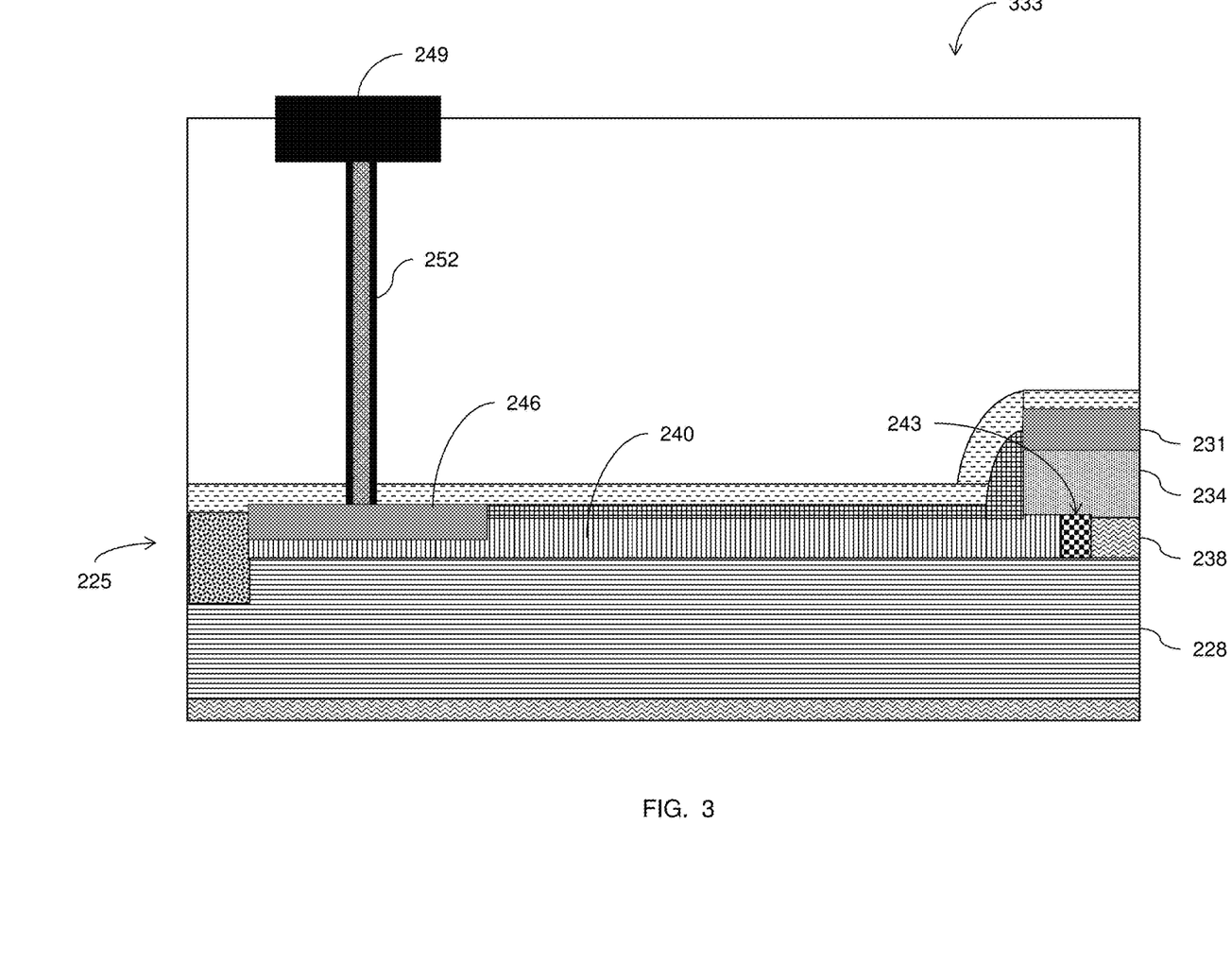

FIG. 3 shows a portion of a semiconductor wafer, indicated generally as 333, having an embedded polysilicon resistor body contact with the recrystallization barrier 243 coincident with the p-n junction under the gate portion 234. As described with reference to FIG. 2, the wafer 333 comprises a multilayer substrate 225, which may comprise any conventional semiconductor substrate such as, for example, a bulk silicon substrate or an active layer of semiconductor material of a silicon-on-insulator (SOI) wafer. The multilayer substrate 225 may include a buried oxide (BOX) layer 228 and an active component, such as a field effect transistor (FET) 231, as would be known by one of ordinary skill in the art. As shown in FIG. 3, an n-type region 238 is illustrated with the gate portion 234. The n-type region 238 of the diode formed under the t-body gate 234 is formed from n-type diffusion of dopants from the n-type S/D and extension regions of the FET 231. The multilayer substrate 225 may also include a p-type polysilicon resistor 240 formed by amorphizing a single crystal silicon, forming a recrystallization barrier 243, and recrystallizing to polysilicon using a thermal anneal. The recrystallization barrier 243 prevents the amorphized region of the polysilicon resistor 240 from recrystallizing back to single crystal silicon. As shown in FIG. 3, an angled amorphization implant may be used to fully amorphize under the gate portion 234 of the FET 231 in order to form the recrystallization barrier 243. The polysilicon body contact resistor 240 may be connected to a body contact 246, which is connected to an electrical contact 249 by a via 252 or other means known by one of ordinary skill in the art.

Figure 4:
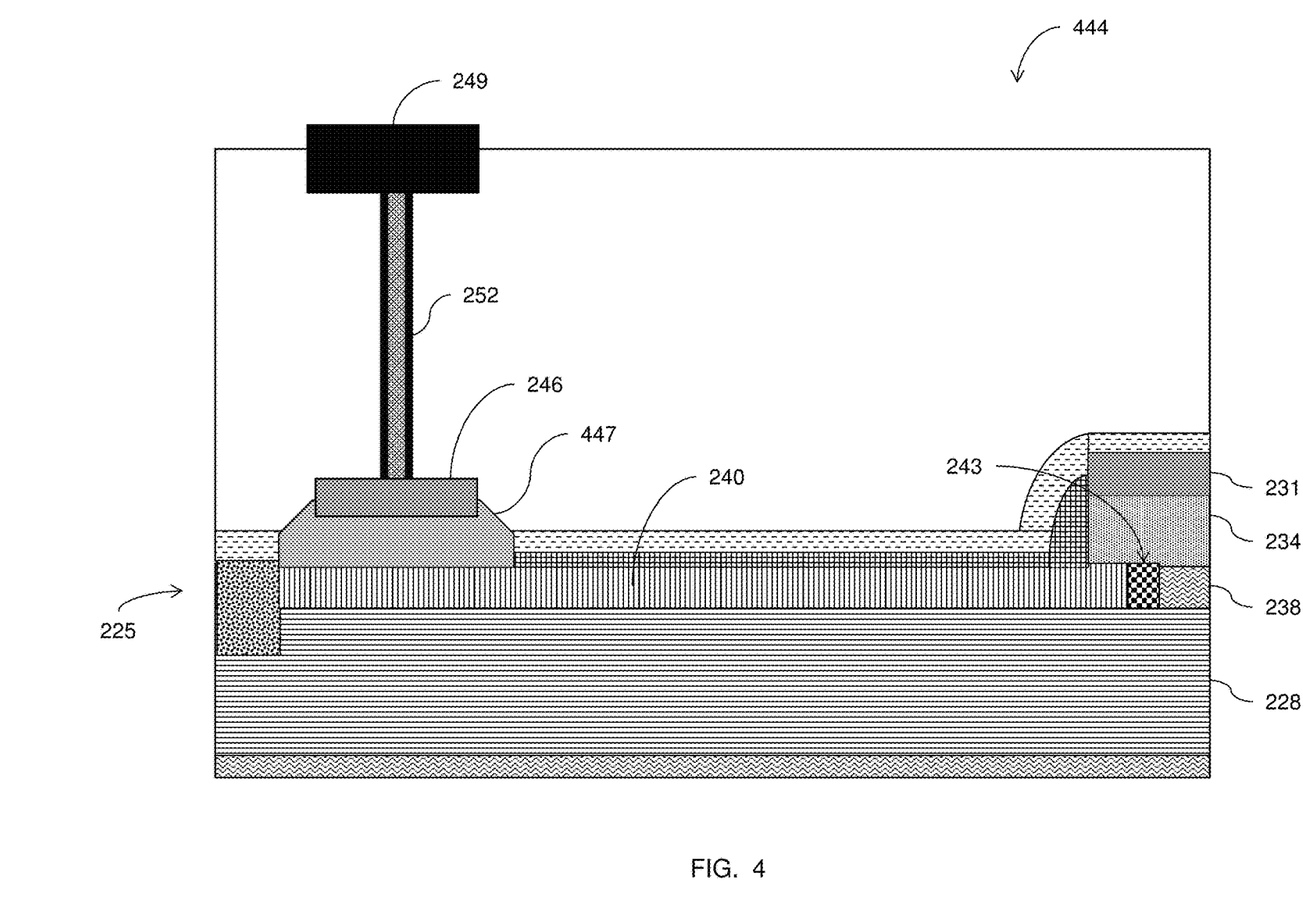

FIG. 4 shows a portion of a semiconductor wafer, indicated generally as 444, having an embedded polysilicon resistor body contact with the recrystallization barrier 243 coincident with the p-n junction under the gate portion 234, as illustrated in FIG. 3. As described with reference to FIG. 2, the wafer 444 comprises a multilayer substrate 225, which may comprise any conventional semiconductor substrate such as, for example, a bulk silicon substrate or an active layer of semiconductor material of a silicon-on-insulator (SOI) wafer. The multilayer substrate 225 may include a buried oxide (BOX) layer 228 and an active component, such as a field effect transistor (FET) 231, as would be known by one of ordinary skill in the art. The n-type region 238 is illustrated with the gate portion 234 of the FET 231. The multilayer substrate 225 may also include a p-type polysilicon body contact resistor region 240 formed by amorphizing a single crystal silicon, forming a recrystallization barrier 243, and recrystallizing to polysilicon using a thermal anneal. The recrystallization barrier 243 prevents the amorphized region of the polysilicon body contact resistor 240 from recrystallizing back to single crystal silicon. As described with reference to FIG. 3, an angled amorphization implant may be used to fully amorphize under the gate portion 234 of the FET 231 in order to form the recrystallization barrier 243. As shown in FIG. 4, the polysilicon body contact resistor 240 may be connected to a raised body contact 447, which is connected to an electrical contact 249 by a via 252 or other means known by one of ordinary skill in the art. The raised body contact 447 may be formed by selective epitaxial growth of the polysilicon or silicon-germanium (SiGe) followed by amorphization implant into the body with the recrystallization barrier 243.

In other words, a monocrystalline semiconductor layer has a region that is designated to become a resistor. This resistor region (or portion thereof) is amorphized by an ion implant process. A "recrystallization barrier" is formed adjacent the amorphized semiconductor material so as to physically separate it from the remaining single crystalline semiconductor material of the semiconductor layer. Then, an anneal process is subsequently performed. The "recrystallization barrier" doesn't prevent recrystallization of the amorphized semiconductor material, but instead prevents the single crystalline semiconductor material from acting as a seed layer during recrystallization. Thus, instead of recrystallizing to become monocrystalline in structure, the amorphized semiconductor material takes on the desired polycrystalline structure for the polycrystalline resistor.

Figure 5:
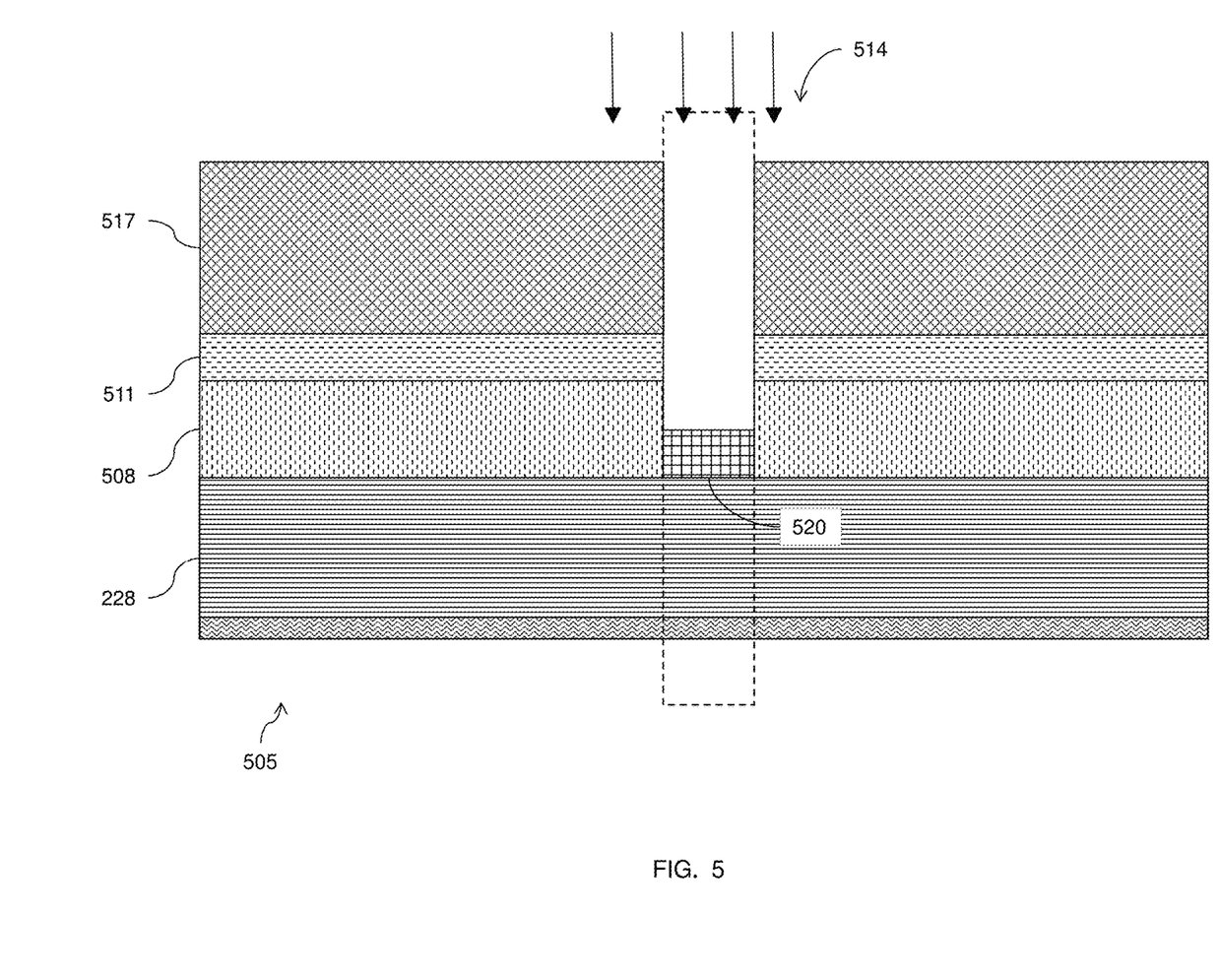

FIGS. 5-10 illustrate various processing steps for forming a substrate, indicated generally as 505, according to devices and methods herein. As shown in FIG. 5, the substrate 505 includes a buried oxide (BOX) layer 228, a silicon body 508, and a sacrificial layer 511. The sacrificial layer 511 may be made of any suitable barrier layer material, such as, for example, nitride, oxynitride, etc. The sacrificial layer 511 may cover portions of the silicon body 508 and devices (e.g., transistors, etc.) formed in the substrate 505, as described above.

FIG. 5 also shows a trench 514 extended into the substrate 505. As depicted in FIG. 5, the trench 514 is formed through the sacrificial layer 511 and, at least partially, into the silicon body 508. According to devices and methods herein, the trench 514 may be formed by etching the sacrificial layer 511 using an appropriate photoresist material 517, as would be known by one skilled in the relevant art. One or more conventional etch processes, such as a reactive ion etch (RIE), may be used to form the trench 514. For example, a respective RIE process may be performed for etching each of the sacrificial layer 511 and silicon body 508, with each respective RIE process being tailored to the material of the feature being etched.

The trench 514 may be a conventional shallow trench isolation structure formed using conventional semiconductor fabrication processes and materials, as described in further detail below. For example, the trench 514 may be created by forming a photoresist material 517 on the substrate 505, exposing and developing the photoresist, etching an STI trench in the substrate through the patterned photoresist, stripping the photoresist, filling the trench with an STI material (e.g., $SiO_2$), and planarizing the top surface of the structure (e.g., via etch or chemical mechanical polish (CMP)).

Still referring to FIG. 5, after stripping the photoresist material 517, an amorphization implant using nitrogen (N2), argon (Ar), germanium (Ge), or xenon (Xe) may be performed. A nitridation barrier 520 may be formed in the trench 514 using thermal ammonia (NH3) treatment in a furnace for rapid thermal annealing (RTA).

Figure 6:
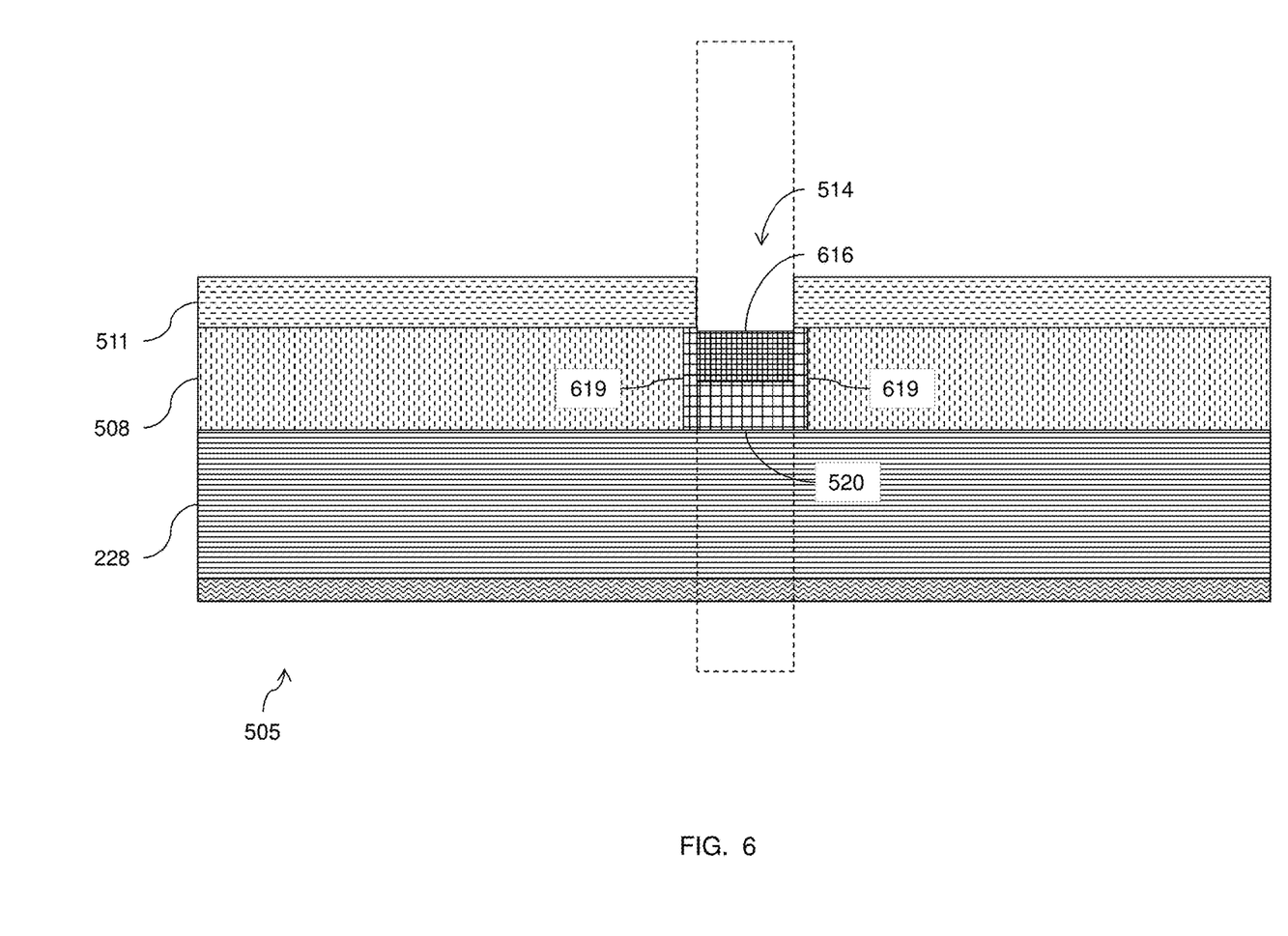

Referring to FIG. 6, polysilicon fill 616 can be used to fill the trench 514. Excess material may be removed using an appropriate planarization process. Any suitable planarization process may be used, such as etch or chemical mechanical polish (CMP). (The polysilicon fill 616 can also be part of the gate structure with the gate oxide removed.) Alternatively, the trench 514 can be formed through the silicon body 508, sidewalls 619 are nitridized, and then the trench is filled with polysilicon fill 616. Optionally, a second nitridation or implantation process can be performed.

Figure 7:
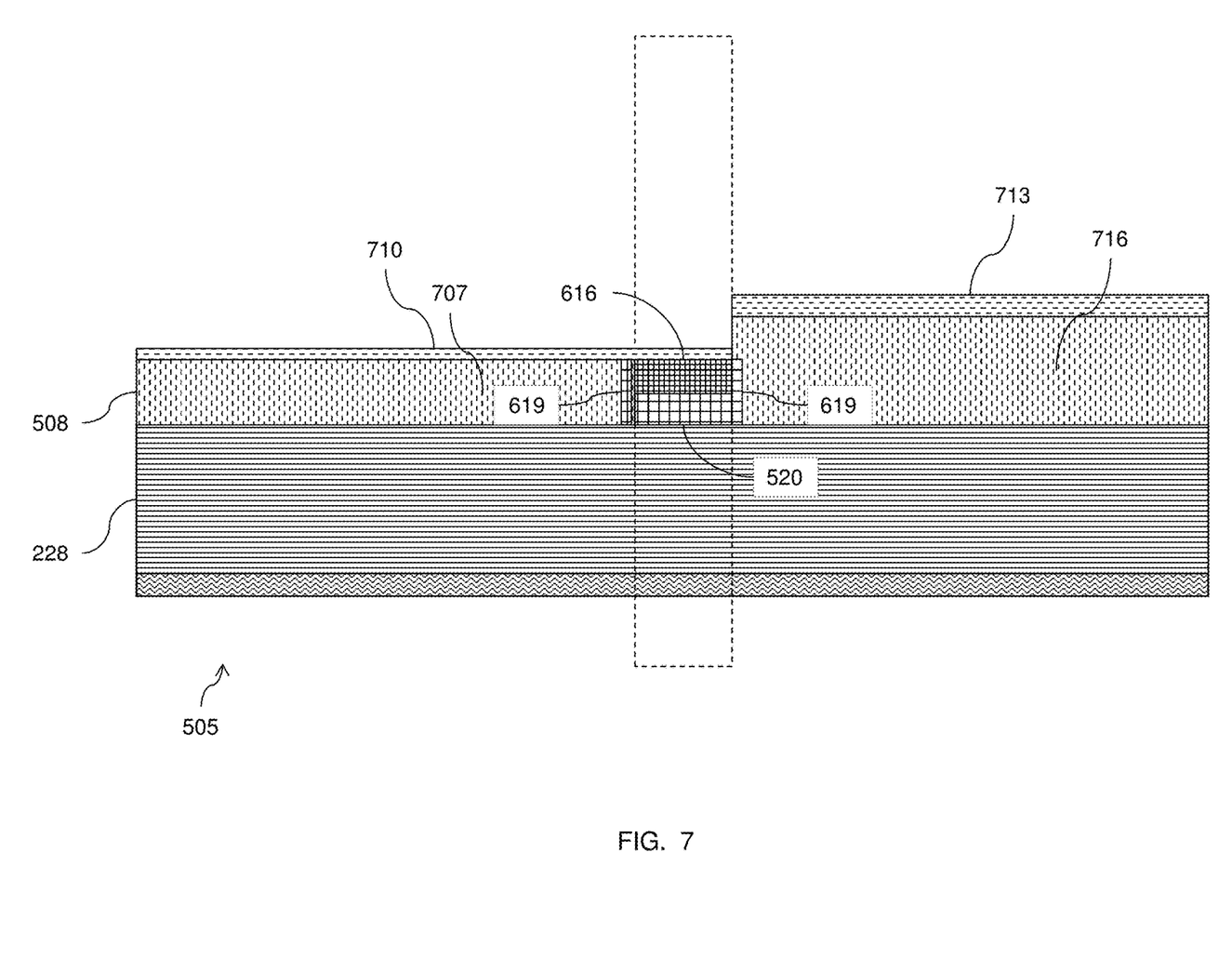

As shown in FIG. 7, a material removal process is used to remove the sacrificial layer 511 and reduce the height of a portion of the silicon body 508 for the polysilicon resistor area 707. A thin oxide layer 710 is deposited over the polysilicon resistor area 707 and the polysilicon fill 616. In addition, a gate oxide layer 713 is deposited over the gate area 717 of the silicon body 508.

Figure 8:
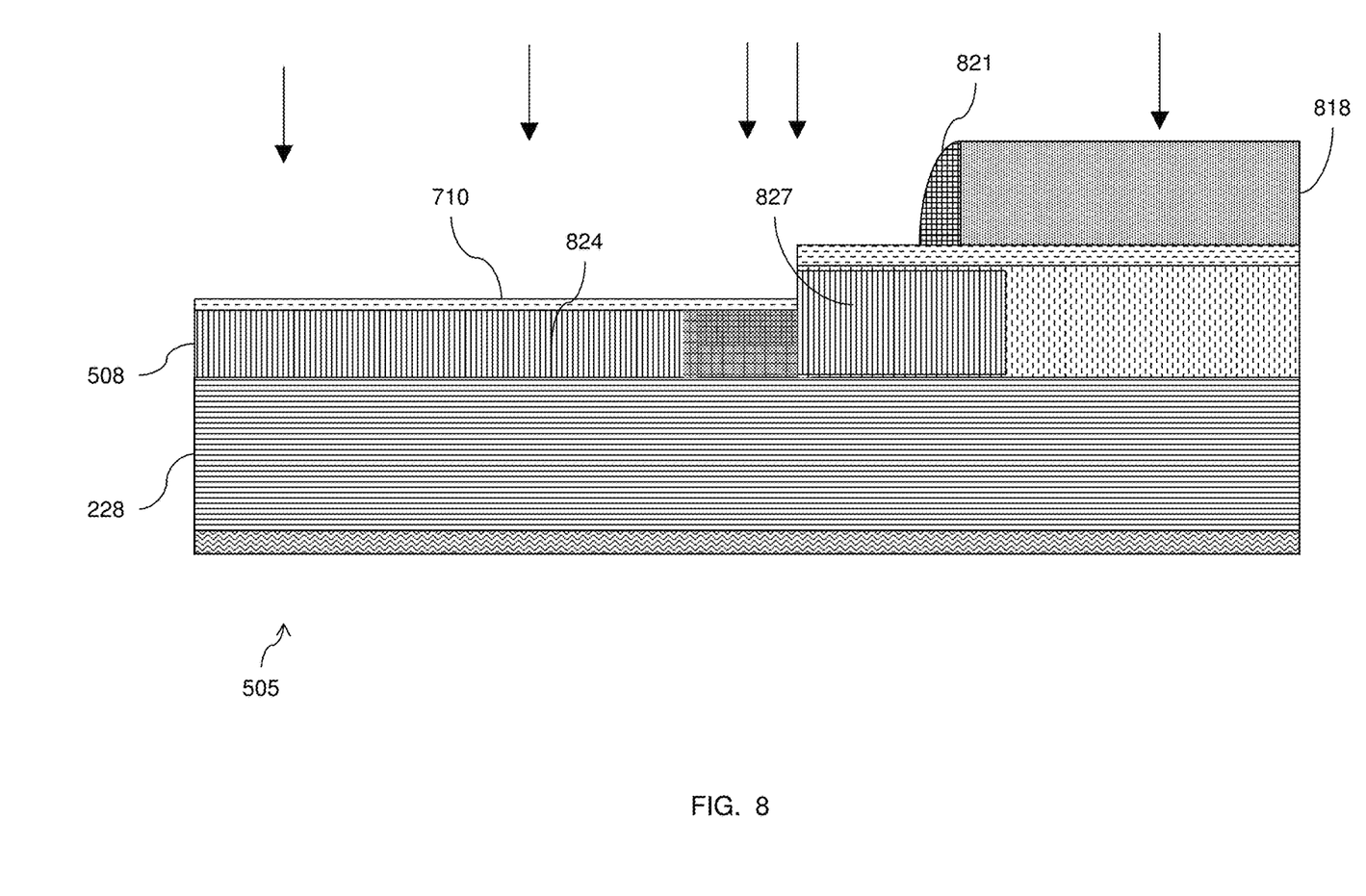

In FIG. 8, polysilicon for the gate 818 is deposited and may be etched, as appropriate. A spacer 821 may be formed around the gate 818. Blanket amorphization is performed using an appropriate ion implant, such as nitrogen (N2), argon (Ar), germanium (Ge), or xenon (Xe). Other appropriate materials may be used. The amorphization implant fully amorphizes the resistor area 824, and fully or partially amorphizes the area 827 for creation of the body contact to the FET.

The use of dual or multiple oxidations allows localized thinning of the resistor body such that a blanket amorphization implant of the body contact region can fully amorphize the resistor body while providing an optimized doping profile for the body contact region. Subsequent annealing of the structure will recrystallize the body contact regions to single crystal and resistor regions to poly-crystalline in order to provide high sheet rho resistors for body contact.

After the single crystal silicon has been fully amorphized, a thermal anneal is performed to re-crystalize to polysilicon. The recrystallization barrier 243, described above prevents the amorphized region of the resistor area 824 from recrystallizing back to single crystal silicon. The anneal process recrystallizes the amorphized semiconductor material so that it becomes polycrystalline in structure (i.e., the recrystallization barrier 243 does not prevent recrystallization to a polycrystalline state). The recrystallization barrier 243 may be formed using ion implant of carbon (C), oxygen (O), fluorine (F), nitrogen (N), argon (Ar), or xenon (Xe) into the amorphized single crystal silicon. Other appropriate materials may be used.

Figure 9:
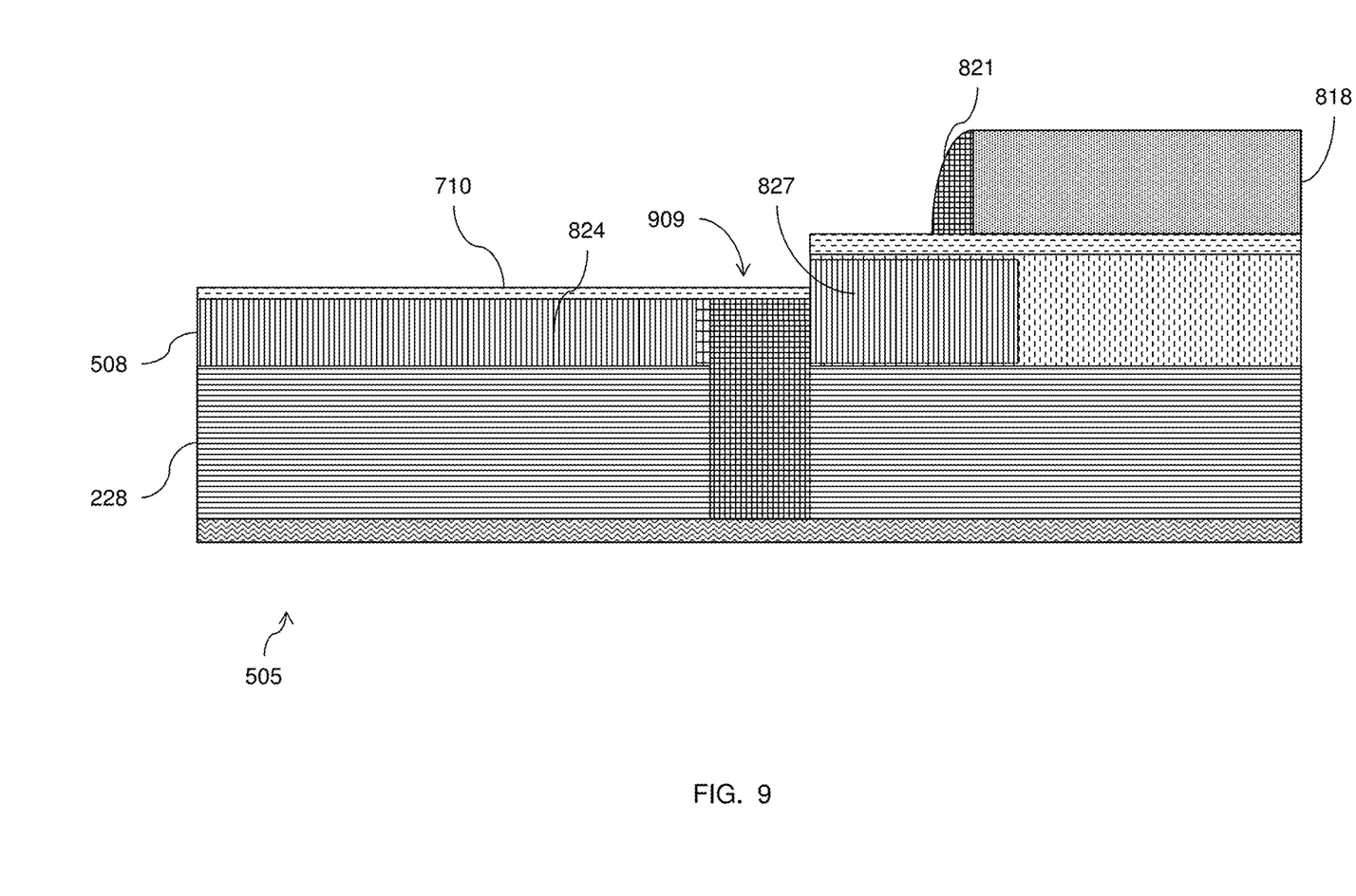

In some cases, the recrystallization barrier 243 may be a tunneling barrier. A tunneling barrier may include a thin insulating layer between two electrically conducting materials. According to devices and methods herein, a tunneling barrier may be formed using thermal nitridation of the single crystal silicon or a combination of amorphizing implant and a thermal barrier. FIGS. 5-8 show examples of a tunnel barrier formed in a shallow trench. FIG. 9 shows an example of a tunnel barrier formed in a deep trench 909.

Figure 10:
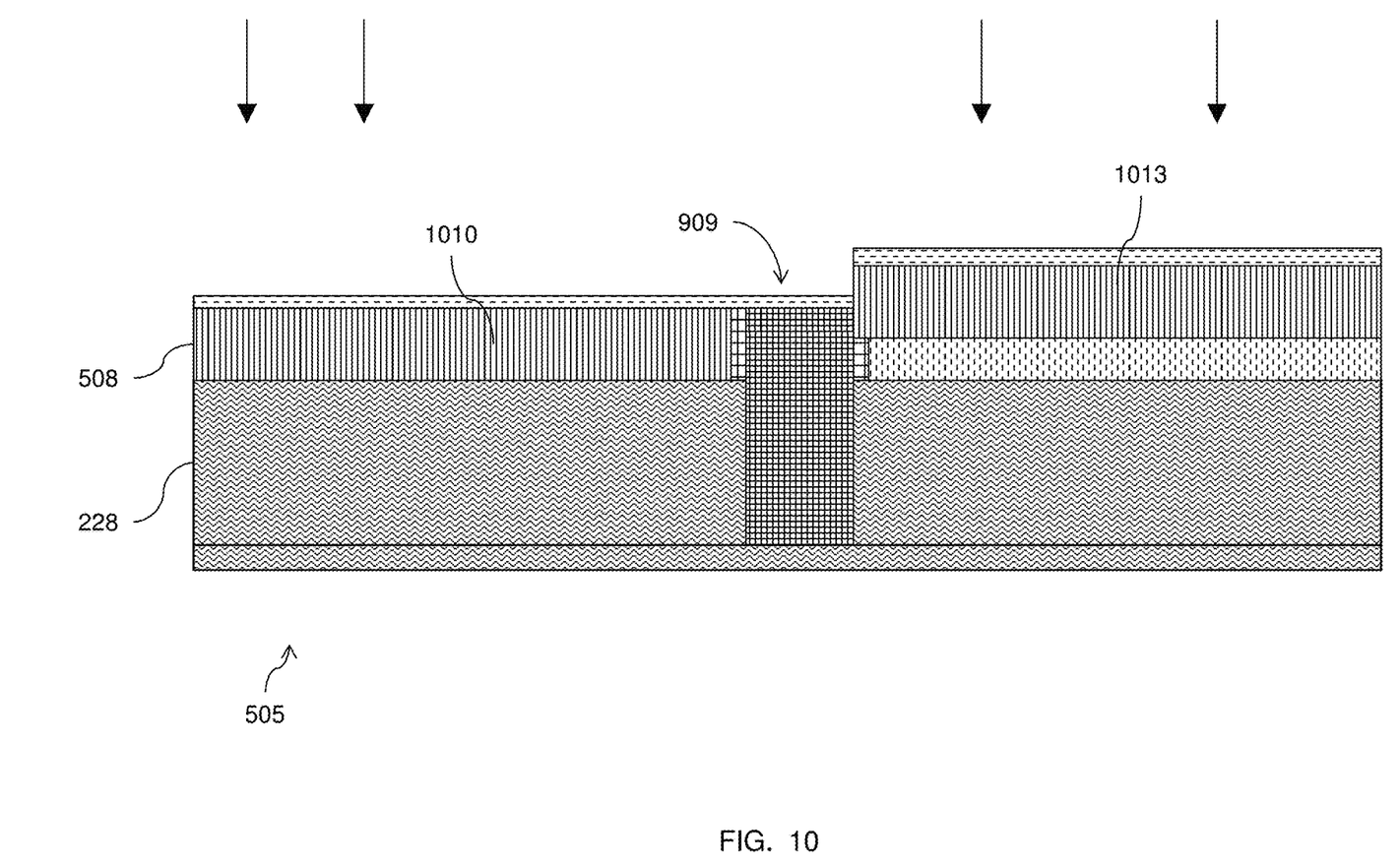

FIG. 10 shows an example for forming dual resistors with a deep trench. A fully amorphized and a partially amorphized resistor is formed with the same amorphizing implant. Following the amorphization, re-crystallization anneal of the body contact is performed. This results in a polycrystalline resistor 1010 and single crystal resistor 1013.

According to devices and methods herein, the footprint of the switch FET is reduced with lower wiring capacitance. This provides multiple sheet rho values for analog design options, and enables connecting each body contact to a single resistor instead of connecting all body contacts to a resistor in series.

A structure formed using the methods herein may include source, drain, and body contact of a FET or multi-finger FET, or stacks of multi-finger FETs that are connected to embedded resistors using silicided single crystal silicon and unsilicided embedded polysilicon that form high resistance bias resistors with reduced parasitics. The resistance values are defined by the body contact implant.

While only one or a limited number of transistors or devices are illustrated in the drawings, those ordinarily skilled in the art would understand that many different types of transistors or other technology could be simultaneously formed with the embodiment herein and the drawings are intended to show simultaneous formation of multiple different types of devices; however, the drawings have been simplified to only show a limited number of devices for clarity and to allow the reader to more easily recognize the different features illustrated. This is not intended to limit this disclosure because, as would be understood by those ordinarily skilled in the art, this disclosure is applicable to structures that include many of each type of transistor or technology shown in the drawings.

The methods as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular examples of the disclosed structures and methods and is not intended to be limiting of this disclosure. For example, as used herein, the singular forms "a", "an", and "the" are intended to include the plural forms as well, unless the context clearly indicates otherwise. Additionally, as used herein, the terms "comprises", "comprising", and/or "including", when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various devices and methods of the present disclosure have been presented for purposes of illustration, but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein.

While various examples are described herein, it will be appreciated from the specification that various combinations of elements, variations, or improvements therein may be made by those skilled in the art, and are within the scope of the disclosure. In addition, many modifications may be made to adapt a particular situation or material to the teachings of the disclosed concepts without departing from the essential scope thereof. Therefore, it is intended that the concepts not be limited to the particular examples disclosed as the best mode contemplated for carrying out the devices and methods herein, but that the devices and methods will include all features falling within the scope of the appended claims.

What is claimed is:

1. A method comprising:
    forming a transistor in and above a crystalline active region that is positioned in a semiconductor layer of a multilayer semiconductor device;
    defining a resistor region in single crystal semiconductor material of the semiconductor layer formed on a buried insulating layer, the resistor region being adjacent the transistor;
    forming an amorphized semiconductor material in the resistor region by implanting a first ion into the resistor region;
    forming a barrier in the amorphized semiconductor material by implanting a second ion into at least a portion of the amorphized semiconductor material, the barrier being between the transistor and an electrical body contact for the transistor and physically separating the amorphized semiconductor material in the resistor region of the semiconductor layer from the single crystal semiconductor material of the semiconductor layer; and
    annealing the amorphized semiconductor material, the barrier preventing the amorphized semiconductor material in the resistor region from recrystallizing back to single crystal silicon.

2. The method according to claim 1, the first ion implant comprising one of:
    nitrogen (N2), argon (Ar), germanium (Ge), and xenon (Xe).

3. The method according to claim 1, the second ion implant comprising one of carbon (C), oxygen (O), fluorine (F), nitrogen (N), argon (Ar), and xenon (Xe).

4. The method according to claim 1, the barrier further comprising a tunneling barrier formed in a trench.

5. The method according to claim 1, the annealing recrystallizing the amorphized semiconductor material into a polycrystalline structure.

6. A method, comprising:
    forming a resistor region and a crystalline active region in a semiconductor layer that is formed on a buried insulating layer;
    forming a transistor element in and above the crystalline active region;
    forming an amorphized semiconductor material in the resistor region;
    forming a barrier in the amorphized semiconductor material by implanting an ion into at least a portion of the amorphized semiconductor material, the barrier being between the transistor element and an electrical body contact for the transistor element and physically separating the amorphized semiconductor material in the resistor region of the semiconductor layer from the crystalline active region of the semiconductor layer; and
    annealing the amorphized semiconductor material, the annealing recrystallizing the amorphized semiconductor material into a polycrystalline structure.

7. The method according to claim 6, the resistor region comprising single crystal semiconductor material.

8. The method according to claim 7, the forming the barrier further comprising:
    thermal nitridation of the single crystal semiconductor material.

9. The method according to claim 6, the barrier preventing the amorphized semiconductor material from recrystallizing back to single crystal semiconductor material.

10. The method according to claim 6, the forming the amorphized semiconductor material further comprising implanting an ion of one of nitrogen (N2), argon (Ar), germanium (Ge), and xenon (Xe) into the resistor region.

11. The method according to claim 6, the barrier being formed using ion implant comprising one of carbon (C), oxygen (O), fluorine (F), nitrogen (N), argon (Ar), and xenon (Xe).

12. The method according to claim 6, the barrier further comprising a tunneling barrier formed in a trench.

* * * * *